(12) United States Patent
Nakano et al.

(10) Patent No.: US 11,189,709 B2
(45) Date of Patent: Nov. 30, 2021

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 22 days.

(21) Appl. No.: 16/541,719

(22) Filed: Aug. 15, 2019

(65) Prior Publication Data

US 2019/0371907 A1 Dec. 5, 2019

Related U.S. Application Data (63) Continuation of application No. 15/527,105, filed as application No. PCT/JP2015/082043 on Nov. 13, 2015, now abandoned.

(30) Foreign Application Priority Data

Nov. 18, 2014 (JP) ................................ 2014-233653

(51) Int. Cl.
*H01L 29/66* (2006.01)
*H01L 29/12* (2006.01)
(Continued)

(52) U.S. Cl.
CPC .... *H01L 29/66068* (2013.01); *H01L 21/0465* (2013.01); *H01L 21/0475* (2013.01);
(Continued)

(58) Field of Classification Search
CPC ............. H01L 21/0475; H01L 29/0696; H01L 29/086; H01L 29/0869; H01L 29/1045;
(Continued)

(56) References Cited

U.S. PATENT DOCUMENTS 5,350,934 A * 9/1994 Matsuda ............... H01L 29/739
257/139
5,693,569 A 12/1997 Ueno
(Continued)

FOREIGN PATENT DOCUMENTS

CN 103779419 5/2014
JP 2008098593 4/2008
(Continued)

OTHER PUBLICATIONS

Office Action issued for Japanese Patent Application No. 2016-560197, Dispatch dated Dec. 12, 2019, 10 pages including English machine translation.
(Continued)

*Primary Examiner* — Jay C Kim
(74) *Attorney, Agent, or Firm* — Hamre, Schumann, Mueller & Larson, P.C.

(57) ABSTRACT

A semiconductor device of the present invention includes a semiconductor layer, a gate trench that defines a source region of a first conductivity type in the semiconductor layer, a channel region of a second conductivity type of a lower part of the source region, a source trench that passes through the source region and the channel region, an impurity region of the second conductivity type of a bottom part and a side part of the source trench, a source electrode on the semiconductor layer, and a highly-concentrated impurity region of the second conductivity type, the highly-concentrated impurity region having a contact portion connected to the source electrode at a surface of the semiconductor layer, the highly-concentrated impurity region passing through the source region and extending to a position deeper than the source region, the highly-concentrated impurity region having a concentration higher than the impurity region.

18 Claims, 11 Drawing Sheets

(51) Int. Cl.
*H01L 29/16* (2006.01)
*H01L 29/417* (2006.01)
*H01L 29/10* (2006.01)
*H01L 29/40* (2006.01)
*H01L 21/04* (2006.01)
*H01L 29/06* (2006.01)
*H01L 29/08* (2006.01)
*H01L 29/78* (2006.01)

(52) U.S. Cl.
CPC ........ *H01L 29/0696* (2013.01); *H01L 29/086* (2013.01); *H01L 29/0869* (2013.01); *H01L 29/1045* (2013.01); *H01L 29/1095* (2013.01); *H01L 29/12* (2013.01); *H01L 29/1608* (2013.01); *H01L 29/407* (2013.01); *H01L 29/41766* (2013.01); *H01L 29/7813* (2013.01); *H01L 21/047* (2013.01)

(58) Field of Classification Search
CPC ........... H01L 29/66068; H01L 29/7813; H01L 21/0465; H01L 21/047
See application file for complete search history.

(56) References Cited

U.S. PATENT DOCUMENTS

| | | | |
|---|---|---|---|
| 5,895,951 A * | 4/1999 | So | H01L 29/407 257/330 |
| 6,188,105 B1 | 2/2001 | Kocon et al. | |
| 6,396,090 B1 * | 5/2002 | Hsu | H01L 29/0661 257/242 |
| 6,608,350 B2 | 8/2003 | Kinzer et al. | |
| 6,621,107 B2 * | 9/2003 | Blanchard | H01L 29/7813 257/155 |
| 6,750,511 B2 | 6/2004 | Kawano et al. | |
| 7,026,668 B2 * | 4/2006 | Hatakeyama | H01L 29/0615 257/264 |
| 7,087,958 B2 * | 8/2006 | Chuang | H01L 29/402 257/335 |
| 7,112,843 B2 * | 9/2006 | Takaishi | H01L 29/7813 257/330 |
| 7,323,386 B2 | 1/2008 | Yilmaz | |
| 7,345,342 B2 | 3/2008 | Challa et al. | |
| 7,671,441 B2 * | 3/2010 | Henson | H01L 29/7813 257/500 |
| 7,755,138 B2 | 7/2010 | Saito et al. | |
| 7,834,376 B2 | 11/2010 | Carta et al. | |
| 7,843,004 B2 | 11/2010 | Darwish | |
| 7,973,381 B2 * | 7/2011 | Chiola | H01L 29/407 257/483 |
| 8,076,719 B2 | 12/2011 | Zeng et al. | |
| 8,188,538 B2 | 5/2012 | Nakano et al. | |
| 8,354,711 B2 | 1/2013 | Zeng et al. | |
| 8,362,547 B2 | 1/2013 | Bhalla et al. | |
| 8,390,060 B2 | 3/2013 | Darwish et al. | |
| 8,420,483 B2 | 4/2013 | Darwish | |
| 8,546,893 B2 | 10/2013 | Darwish et al. | |
| 8,581,341 B2 | 11/2013 | Darwish et al. | |
| 8,680,607 B2 | 3/2014 | Zeng et al. | |
| 8,723,254 B2 | 5/2014 | Hikichi | |
| 8,928,065 B2 * | 1/2015 | Hsu | H01L 29/7811 257/328 |
| 9,024,379 B2 | 5/2015 | Darwish et al. | |
| 9,041,100 B2 | 5/2015 | Yoshimochi | |
| 9,093,522 B1 | 7/2015 | Zeng et al. | |
| 9,136,322 B2 | 9/2015 | Nakano et al. | |
| 9,153,652 B2 * | 10/2015 | Liu | H01L 29/7393 |
| 9,184,286 B2 | 11/2015 | Nakano | |
| 9,224,860 B2 * | 12/2015 | Kagawa | H01L 29/7811 |
| 9,419,092 B2 | 8/2016 | Carta et al. | |
| 9,425,261 B2 * | 8/2016 | Fukui | H01L 21/046 |
| 9,472,405 B2 * | 10/2016 | Nakano | H01L 29/518 |
| 9,478,655 B2 * | 10/2016 | Siemieniec | H01L 29/78 |
| 9,496,384 B2 * | 11/2016 | Nakano | H01L 29/7813 |
| 9,577,073 B2 | 2/2017 | Esteve et al. | |
| 9,812,537 B2 * | 11/2017 | Nakano | H01L 29/66734 |
| 9,853,140 B2 | 12/2017 | Tipirneni et al. | |
| 2008/0073707 A1 * | 3/2008 | Darwish | H01L 29/7813 257/330 |
| 2009/0206924 A1 * | 8/2009 | Zeng | H01L 29/66727 327/581 |
| 2010/0258863 A1 * | 10/2010 | Kaneko | H01L 29/42376 257/330 |
| 2011/0254088 A1 | 10/2011 | Darwish et al. | |
| 2012/0080748 A1 | 4/2012 | Hsieh | |
| 2012/0261746 A1 | 10/2012 | Darwish et al. | |
| 2013/0270576 A1 * | 10/2013 | Masuda | H01L 29/7802 257/77 |
| 2014/0042535 A1 | 2/2014 | Darwish et al. | |
| 2014/0084359 A1 | 3/2014 | Tsuchiya et al. | |
| 2015/0279983 A1 * | 10/2015 | Tanaka | H01L 29/1095 257/329 |
| 2017/0040425 A1 | 2/2017 | Kueck et al. | |

FOREIGN PATENT DOCUMENTS

| | | | |
|---|---|---|---|
| JP | 2014038988 | 2/2014 | |
| JP | 2014067754 | 4/2014 | |
| JP | WO 2014/103256 | * 7/2014 | ............ H01L 29/78 |
| JP | 2014175314 | 9/2014 | |
| JP | 2014216410 | 11/2014 | |
| WO | 2012105609 | 8/2012 | |
| WO | 2012131768 | 10/2012 | |

OTHER PUBLICATIONS

Office Action issued for Chinese Patent Application No. 201580062793. 2, dated Jan. 19, 2020, 18 pages including English machine translation.
International Search Report for PCT/JP2015/082043, dated Feb. 2, 2016, 3 pages including English translation.
International Preliminary Report on Patentability for PCT/JP2015/082043, dated Jun. 1, 2017, 17 pages including English translation.

* cited by examiner

FIG. 11

SEMICONDUCTOR DEVICE AND METHOD FOR MANUFACTURING SEMICONDUCTOR DEVICE

TECHNICAL FIELD

The present invention relates to a semiconductor device that has a trench gate structure, and relates to a method for manufacturing the semiconductor device.

BACKGROUND ART

For example, Patent Document 1 discloses a power MOSFET that includes a semiconductor substrate forming a drain, a trench formed at a surface of the semiconductor substrate, a gate electrode formed in the trench through a gate insulating film, a body diffusion layer formed on the surface side of the semiconductor substrate, a source diffusion layer formed at the surface of the semiconductor substrate, an interlayer insulating film formed on the gate electrode, a source electrode film formed on the semiconductor substrate, a source trench that is formed apart from the trench, and a p type contact diffusion layer formed at a bottom surface of a source trench.

PRIOR ART DOCUMENTS

Patent Literature

Patent Document 1: Japanese Patent Application Publication No. 2008-98593

SUMMARY OF THE INVENTION

Technical Problem

One preferred embodiment of the present invention provides a semiconductor device capable of restraining variation in gate threshold voltage in a transistor structure that has a source trench passing through a source region and a channel region and that additionally has an impurity region of a second conductivity type at a bottom part and a side part of the trench, and provides a method for manufacturing the semiconductor device.

Solution to Problem

One preferred embodiment of the present invention provides a semiconductor device including a semiconductor layer, a gate trench that defines a source region of a first conductivity type in the semiconductor layer, a channel region of a second conductivity type of a lower part of the source region, a source trench that passes through the source region and the channel region, an impurity region of the second conductivity type of a bottom part and a side part of the source trench, a source electrode on the semiconductor layer, and a highly-concentrated impurity region of the second conductivity type that has a contact portion connected to the source electrode at a surface of the semiconductor layer and that passes through the source region and extends to a position deeper than the source region and that has a concentration higher than the impurity region.

According to this arrangement, it is possible to use the highly-concentrated impurity region as electric-charge path to the channel region. It is possible to restrain variation in gate threshold voltage by using the region that is lower in resistance than impurity region of the bottom part and the side part of the source trench as an electric-charge path. As a result, it is possible to restrain variation in ΔVth between chips in a semiconductor wafer plane, and therefore, if a module is formed by use of a plurality of chips that are individual pieces created from a semiconductor wafer in which the thus formed structure has been employed, it is possible to reduce a switching time lag in the module.

In one preferred embodiment of the present invention, the source trench may be formed as a single source trench or as two source trenches in a cutting plane that appears when the semiconductor layer is cut in a direction of a depth of the source trench.

In one preferred embodiment of the present invention, the highly-concentrated impurity region is formed apart from a channel portion located on a side surface of the gate trench. In this case, the highly-concentrated impurity region may be formed along a side surface of the source trench.

According to this arrangement, it is possible to restrain a rise in gate threshold voltage, and it is possible to obtain a low on-resistance.

In one preferred embodiment of the present invention, the highly-concentrated impurity region is formed so as to extend to a bottom surface of the source trench.

According to this arrangement, it is possible to reduce the sheet resistance of the impurity region of a bottom part of the source trench, and therefore it is possible to reduce the resistance of a body diode formed by the pn junction between the impurity region and a drain region of the semiconductor layer.

In one preferred embodiment of the present invention, the contact portion is selectively formed at a part of the source region.

According to this arrangement, it is possible to widely secure a contact region with respect to the source region in the surface of the semiconductor layer while it is possible to connect the source electrode to a highly-concentrated impurity region (contact portion) required to make the channel region and the source region equal in electric potential to each other. Therefore, it is possible to restrain a rise in source contact resistance.

In one preferred embodiment of the present invention, the highly-concentrated impurity region is formed along an inner surface of the source trench so as to extend to a bottom surface of the source trench, and the contact portion is selectively formed at a part of the source region.

According to this arrangement, it is possible to reduce the sheet resistance of the impurity region of a bottom part of the source trench, and therefore it is possible to reduce the resistance of a body diode formed by the pn junction between the impurity region and a drain region of the semiconductor layer. Additionally, it is possible to widely secure a contact region with respect to the source region in the surface of the semiconductor layer while it is possible to connect the source electrode to a highly-concentrated impurity region (contact portion) required to make the channel region and the source region equal in electric potential to each other. Therefore, it is possible to restrain a rise in source contact resistance.

In one preferred embodiment of the present invention, the contact portion is formed so as to extend in at least two directions from an upper side of the source trench. In this arrangement, if the gate trench is formed in a grid-shaped manner, the source trench may be formed in a quadrangle or a quadrangular ring shape in a plan view in an inner region of the gate trench formed in the grid-shaped manner, and the contact portion may be formed so as to extend outwardly from four sides of the source trench.

According to this arrangement, it is possible to reliably form at least other contact portions even if the mask positionally deviates in one direction, for example, when a highly-concentrated impurity region is formed by ion implantation.

In one preferred embodiment of the present invention, a repeated pattern of a line-and-space shape may be formed by the gate trench and the source trench, or a repeated pattern of a hexagon may be formed by the gate trench.

In one preferred embodiment of the present invention, the highly-concentrated impurity region includes a second contact portion formed at a part of the bottom part of the source trench, and the semiconductor device may include an electrode-film residue disposed at a peripheral part of the bottom part of the source trench.

In one preferred embodiment of the present invention, the electrode-film residue may be formed so as to selectively cover a peripheral edge part of the second contact portion.

In one preferred embodiment of the present invention, the highly-concentrated impurity region includes a second contact portion formed at at-least one part of a peripheral part of the source trench, and the semiconductor device may include an electrode-film residue disposed in the source trench.

In one preferred embodiment of the present invention, the source trench is formed in a ring shape, and the semiconductor device includes a convex portion formed in an inner region of the source trench formed in the ring shape, and the second contact portion is formed at a surface part of the convex portion.

In one preferred embodiment of the present invention, the source trench is formed in a stripe manner, and the semiconductor device includes a convex portion formed between the source trench and the source trench both of which are adjacent to each other, and the second contact portion may be formed at a surface part of the convex portion.

In one preferred embodiment of the present invention, the electrode-film residue may be embedded in the source trench.

In one preferred embodiment of the present invention, the source trench may have a depth equal to a depth of the gate trench, and, meanwhile, may have a width greater than a width of the gate trench.

A method for manufacturing a semiconductor device of the present invention provides a semiconductor-device manufacturing method that includes a step of forming a source region of a first conductivity type and a channel region of a second conductivity type in order from a surface of a semiconductor layer, a step of forming a gate trench that defines the source region so as to have a predetermined shape and a source trench located in the source region, a step of forming an impurity region at a bottom part and a side part of the source trench by implanting an impurity of the second conductivity type into the source trench in a state in which a surface of the source region is masked, and a step of forming a highly-concentrated impurity region, which passes through the source region and extends to a position deeper than the source region and which has a concentration higher than the impurity region, by implanting an impurity of the second conductivity type in a state in which the surface of the source region is partially masked.

This method makes it possible to manufacture a semiconductor device according to one preferred embodiment of the present invention.

In one preferred embodiment of the present invention, the step of forming the highly-concentrated impurity region includes a step of diagonally implanting the impurity of the second conductivity type into a side surface of the source trench by use of a mask that exposes an inside of the source trench.

This method makes it possible to form a highly-concentrated impurity region along the side surface of the source trench without disconnection.

In one preferred embodiment of the present invention, the step of forming the highly-concentrated impurity region includes a step of implanting an impurity under a condition of being higher in dose amount and lower in energy than when the impurity region is formed.

DETAILED DESCRIPTION OF THE PREFERRED EMBODIMENTS

Preferred embodiments of the present invention will be hereinafter described in detail with reference to the accompanying drawings.

Figure 1:
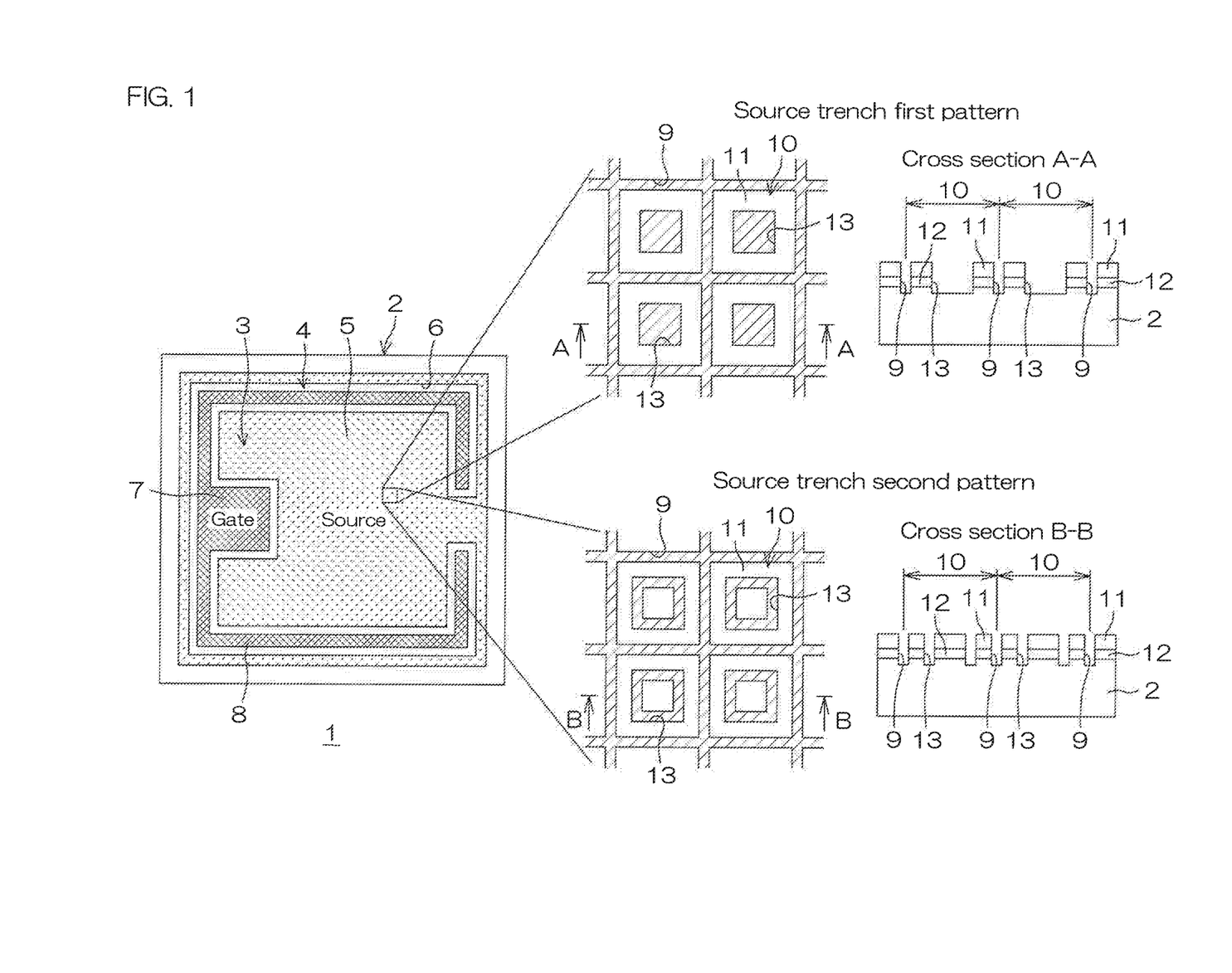
FIG. 1 is a schematic plan view of a semiconductor device according to one preferred embodiment of the present invention.

FIG. 1 is a schematic plan view of a semiconductor device 1 according to one preferred embodiment of the present invention.

The semiconductor device 1 includes a power MOSFET (Metal-Oxide-Semiconductor Field Effect Transistor) element (discrete element) that uses SiC (silicon carbide). For example, the length in the up-down direction of the semiconductor device 1 in the sheet of FIG. 1 is about 1 mm.

The semiconductor device 1 includes a SiC substrate 2 as an example of a semiconductor layer. The SiC substrate 2 is composed of an active portion 3 that is disposed at its central part and that functions as a field-effect transistor and an outer peripheral portion 4 that surrounds the active portion 3.

A source electrode 5 made of, for example, aluminum is formed so as to cover substantially the whole area of the active portion 3. The source electrode 5 has a substantially square shape in a plan view. A removal region 6 that surrounds a central part of the source electrode 5 along the outer peripheral portion 4 is formed at a peripheral edge of the source electrode 5. The removal region 6 has its part selectively hollowed toward the central part of the source electrode 5. A gate pad 7 is placed at this hollowed part. A gate finger 8 made of, for example, aluminum extends over the entire removal region 6 from the gate pad 7 along the outer peripheral portion 4. A pair of gate fingers 8 are formed in a symmetrical shape with respect to the gate pad 7.

A gate trench 9 is formed in the SiC substrate 2 directly under the source electrode 5 etc. The gate trench 9 is formed at the active portion 3. The gate trench 9 is formed in a grid-shaped manner. The pattern of the gate trench 9 is not limited to that of the grid-shaped manner. For example, the gate trench 9 may be formed in a stripe-shaped manner or a honeycomb-shaped manner.

The active portion 3 is partitioned into a larger number of unit cells 10 by means of the gate trench 9. In the active portion 3, many unit cells 10 are regularly arrayed in a matrix manner (columns-and-rows manner). An n$^+$ type source region 11 (for example, a concentration of $1\times10^{18}$ cm$^{-3}$ to $5\times10^{21}$ cm$^{-3}$) is formed at an upper surface of each unit cell 10, and a p type channel region 12 (for example, a concentration of $1\times10^{16}$ cm$^{-3}$ to $1\times10^{19}$ cm$^{-3}$) is formed at a lower part thereof.

A source trench 13 is formed in each unit cell 10. The source trench 13 passes through the n$^+$ type source region 11 and the p type channel region 12. The source trench 13 may have a shape defined by only outer peripheral sides in a plan view (part on the upper side of FIG. 1). In this case, in a cutting plane that appears when the SiC substrate 2 is cut in its depth direction, one source trench 13 appears as shown by a cross section along line A-A (first pattern of the source trench 13). In detail, as shown in FIG. 1, it may be a (regular) quadrangle, a (regular) hexagon, a circle, or the like in a plan view. On the other hand, the source trench 13 may have a shape defined by both sides, i.e., by both the outer peripheral sides and inner peripheral sides in a plan view (part on the lower side of FIG. 1). In this case, in a cutting plane that appears when the SiC substrate 2 is cut in its depth direction, two source trenches 13 appear as shown by a cross section along line B-B (second pattern of the source trench 13). In detail, as shown in FIG. 1, it may be a (regular) quadrangular ring shape, a (regular) hexagonal ring shape, a circular ring shape, or the like in a plan view. It should be noted that the shape of the source trench 13 mentioned above is merely one example, and the source trench 13 may have another shape.

In the outer peripheral portion 4, the gate finger 8 is formed so as to surround the source electrode 5.

Figure 2:
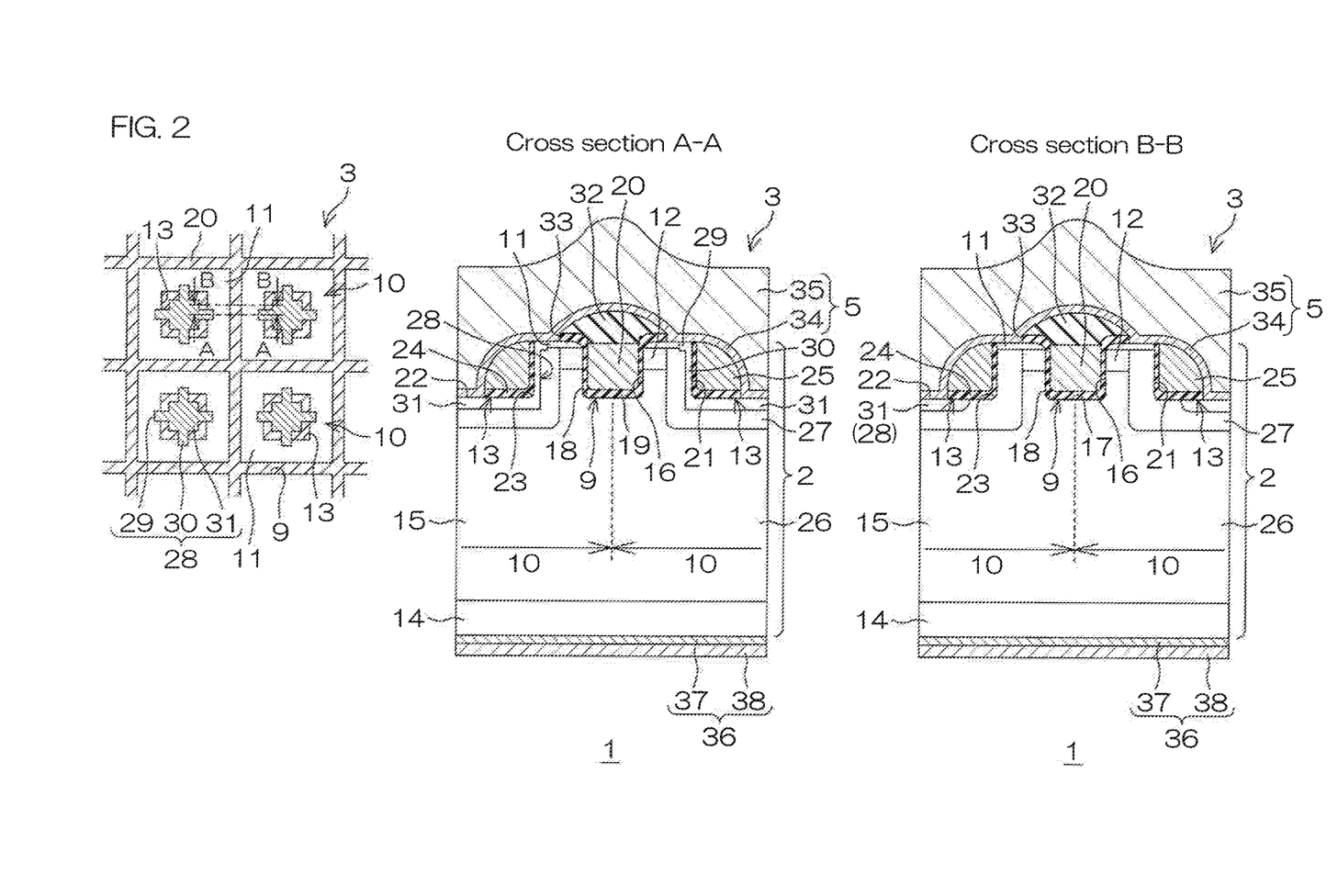
FIG. 2 is a view to describe one preferred embodiment of the semiconductor device.

Next, a structure of the semiconductor device 1 will be described in detail. FIG. 2 is a view that shows one preferred embodiment of the semiconductor device 1 in detail, in which the source trench 13 has the first pattern.

The SiC substrate 2 may be a SiC epitaxial substrate that includes an n$^+$ type base substrate 14 (for example, a concentration of $1\times10^{18}$ cm$^{-3}$ to $5\times10^{21}$ cm$^{-3}$) and an n$^-$ type active layer 15 (for example, a concentration of $1\times10^{14}$ cm$^{-3}$ to $1\times10^{17}$ cm$^{-3}$) that has been generated by epitaxial growth thereon.

The gate trench 9 is formed in the n$^-$ type active layer 15. The gate trench 9 is formed in a grid-shaped manner. The gate trench 9 integrally includes a side surface 16, a bottom surface 17, and a corner portion 18 that is an intersection portion between the side surface 16 and the bottom surface 17. The gate trench 9 is formed in the shape of the letter U in cross section so that the corner portion 18 becomes a curved plane.

A gate insulating film 19 is formed at the inner surface (the side surface 16, the bottom surface 17, and the corner portion 18) of the gate trench 9. The gate insulating film 19 covers the whole area of the inner surface, and covers an upper-end peripheral edge of the unit cell 10. The gate insulating film 19 is made of, for example, an insulating material, such as silicon oxide (SiO$_2$).

A gate electrode 20 is embedded in the gate trench 9. The gate electrode 20 is made of, for example, a conductive material, such as polysilicon.

The source trench 13 is formed at a central part of each unit cell 10. The source trench 13 has the same depth as the gate trench 9, and, on the other hand, has a width larger than the gate trench 9. The source trench 13 integrally includes a side surface 21, a bottom surface 22, and a corner portion 23 that is an intersection portion between the side surface 21 and the bottom surface 22. The source trench 13 is formed in the shape of the letter U in cross section so that the corner portion 23 becomes a curved plane. An insulating-film residue 24 and an electrode-film residue 25 remain at a lower part of the source trench 13. The insulating-film residue 24 is selectively present at the corner portion 23 and around the corner portion 23 so as to expose a central part of the bottom surface 22. The electrode-film residue 25 is present only on the insulating-film residue 24. In other words, the flat surface pattern of the insulating-film residue 24 and that of the electrode-film residue 25 match each other.

The n$^+$ type source region 11, the p type channel region 12, and an n$^-$ type drain region 26 are formed in this order at each unit cell 10 from the front surface of the n$^-$ type active layer 15 toward the reverse surface thereof. These regions 11, 12, and 26 are contiguous to each other. The n$^-$ type drain region 26 is a part of the n$^-$ type active layer 15 that is positionally lower than the p type channel region 12. A trench-gate type MOS transistor structure is thus formed in which the n$^+$ type source region 11 and the n$^-$ type drain region 26 are disposed apart from each other through the p type channel region 12 in the vertical direction perpendicular to a front surface of the SiC substrate 2.

The n$^+$ type source region 11 forms a part of the side surface 16 of the gate trench 9 and a part of the side surface 21 of the source trench 13. Likewise, the p type channel region 12 forms a part of the side surface 16 of the gate trench 9 and a part of the side surface 21 of the source trench 13. The n$^-$ type drain region 26 forms the corner portion 18 and the bottom surface 17 of the gate trench 9 and the corner portion 23 and the bottom surface 22 of the source trench 13.

A p type region 27 is formed at the n$^-$ type active layer 15 (for example, a concentration of $1\times10^{16}$ cm$^{-3}$ to $1\times10^{19}$ cm$^{-3}$). The p type region 27 has a concentration higher than the p type channel region 12. The p type region 27 is formed at a substantially constant thickness along the inner surface of the source trench 13. The p type region 27 has an outer surface that extends in the vertical direction along the side surface 21 from the p type channel region 12 and that extends in the lateral direction along the bottom surface 22. The outer surface on the longitudinal side of the p type region 27 is disposed apart inwardly from the gate trench 9. Therefore, the n– type drain region 26 and the p type channel region 12 connected to the p type region 27 are present in an intermediate region between the outer surface and the gate trench 9. The thickness of the p type region 27 (depth in the lateral direction from the side surface 21 or depth in the longitudinal direction from the bottom surface 22) is, for example, 0.4 μm to 1.5 μm.

A p$^+$ type channel contact region 28 is further formed at the n$^-$ type active layer 15 (for example, a concentration of $1\times10^{18}$ cm$^{-3}$ to $5\times10^{21}$ cm$^{-3}$). The p$^+$ type channel contact region 28 has a concentration higher than the p type channel region 12 and the p type region 27. The p$^+$ type channel contact region 28 integrally includes a first contact portion 29, a longitudinal extension portion 30, and a second contact portion 31.

The first contact portion 29 is selectively formed at a part of the outer peripheral portion (n$^+$ type source region 11) that surrounds the source trench 13. In the present preferred embodiment, it is formed so as to extend outwardly from central parts of four sides of the quadrangular source trench 13 in a plan view. An arrangement is formed such that the first contact portion 29 is formed at only a part of the outer peripheral portion of the source trench 13, and therefore it is possible to widely secure a contact region with respect to the n$^+$ type source region 11 in the front surface of the SiC substrate 2 while it is possible to connect the source electrode 5 to the p$^+$ type channel contact region 28. Therefore, it is possible to restrain a rise in source contact resistance. A forward end of the first contact portion 29 is disposed apart inwardly from the gate trench 9. As a result, the n$^+$ type source region 11 having a predetermined width is secured between the forward end of the first contact portion 29 and the gate trench 9, and therefore, likewise, in this position, it is possible to electrically connect the source electrode 5 to the n$^+$ type source region 11. In the present preferred embodiment, the forward end of the first contact portion 29 is further disposed on an inner side than the outer surface on the longitudinal side of the p type region 27. Additionally, the thickness of the first contact portion 29 (depth in the longitudinal direction from the front surface of the n$^-$ type active layer 15) is 0.1 μm to 0.3 μm.

The longitudinal extension portion 30 extends from the first contact portion 29 to a position deeper than the n$^+$ type source region 11, and faces the p type channel region 12 beside the gate trench 9. The longitudinal extension portion 30 extends along the inner surface of the source trench 13 with substantially the same width as the first contact portion 29, and is connected to the second contact portion 31 in a central part of a region surrounded by the outer peripheral sides of the source trench 13. The longitudinal extension portion 30 is exposed to the inner surface of the source trench 13, and, on the other hand, is disposed apart inwardly from the gate trench 9. This makes it possible to prevent the longitudinal extension portion 30 from being formed in the p type channel region 12 (part in which a channel is formed) on the side surface 16, and hence makes it possible to restrain a rise in gate threshold voltage, and makes it possible to obtain a low on-resistance. The first contact portion 29 is arranged as a drawn portion drawn outwardly from the longitudinal extension portion 30 in an upper part of the source trench 13. Additionally, the thickness (depth in the lateral direction from the side surface 21 of the source trench 13) of the longitudinal extension portion 30 is smaller than the thickness of the first contact portion 29, and is, for example, 0.05 μm to 0.25 μm.

The second contact portion 31 is formed in the region surrounded by the outer peripheral sides of the source trench 13. In the present preferred embodiment, the source trench 13 has a shape defined by only the outer peripheral sides in a plan view, and the second contact portion 31 is selectively formed at the central part of the bottom surface 22 of the source trench 13. The second contact portion 31 is formed so as to have a size large enough to straddle the inside and outside of the insulating-film residue 24. The thickness (depth in the longitudinal direction from the bottom surface 22 of the source trench 13) of the second contact portion 31 is 0.1 μm to 0.3 μm. This thickness is smaller than the thickness of the p type region 27, and therefore the second contact portion 31 is formed in a state of floating to a surface part of the p type region 27. The second contact portion 31 is formed in the p type region 27, and, as a result, it is possible to reduce the sheet resistance of the p type region 27 of a bottom part of the source trench 13. Therefore, it is possible to reduce the resistance of a body diode formed by the pn junction between the p type region 27 and the n$^-$ type drain region 26.

An interlayer film 32 is formed on the SiC substrate 2 so as to cover the gate electrode 20. The interlayer film 32 is made of, for example, an insulating material, such as silicon oxide (SiO$_2$). A contact hole 33 larger in diameter than the source trench 13 is formed in the interlayer film 32. As a result, the n$^+$ type source region 11, the first contact portion 29, and the second contact portion 31 of each unit cell 10 are exposed in the contact hole 33.

The source electrode 5 is formed on the interlayer film 32. The source electrode 5 is connected to the n$^+$ type source region 11, to the first contact portion 29, and to the second contact portion 31 together in the contact hole 33. The source electrode 5 has a layered structure consisting of a barrier layer 34 and a metal layer 35. The barrier layer 34 is stacked on the interlayer film 32, and the metal layer 35 is formed thereon. The barrier layer 34 is made of, for example, titanium/titanium nitride (Ti/TiN), and the metal layer 35 is made of, for example, aluminum (Al) or an aluminum-copper alloy (Al—Cu).

A drain electrode 36 is formed at a reverse surface of the SiC substrate 2. The drain electrode 36 is an electrode shared among all unit cells 10. The drain electrode 36 has a layered structure consisting of a metal silicide layer 37 and a metal layer 38. The metal silicide layer 37 is stacked on the SiC substrate 2, and the metal layer 38 is formed thereon. The metal silicide layer 37 is made of, for example, nickel (Ni) silicide, titanium (Ti) silicide, or the like, and the metal layer 38 is made of, for example, aluminum (Al) or an aluminum-copper alloy (Al—Cu).

Figure 3:
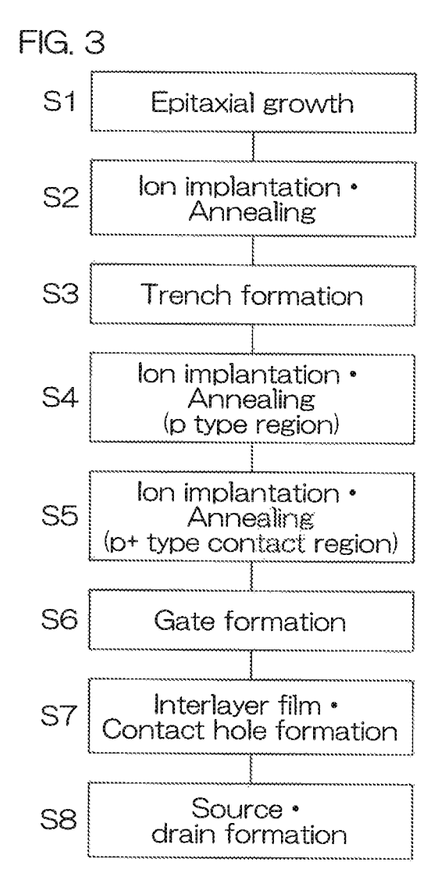
FIG. 3 is a flowchart to describe a method for manufacturing the semiconductor device.

FIG. 3 is a flowchart to describe a method for manufacturing the semiconductor device 1.

In order to manufacture the semiconductor device 1, first, a SiC crystal is grown on the base substrate 14 while being doped with an n type impurity (for example, N (nitrogen), P (phosphorus), As (arsenic), or the like) according to an epitaxial growth method, such as a CVD method, an LPE method, or an MBE method (step S1). As a result, the n$^-$ type active layer 15 is formed on the base substrate 14.

Thereafter, a p type impurity (for example, Al (aluminum), B (boron), or the like) is implanted into the n type active layer 15. Thereafter, an n type impurity is implanted into the n$^-$ type active layer 15. Thereafter, the SiC substrate 2 is annealed at, for example, 1400° C. to 2000° C. (step S2). As a result, the p type impurity and the n type impurity that have been implanted into the n$^-$ type active layer 15 are activated, and the p type channel region 12 and the n$^+$ type source region 11 are simultaneously formed in accordance with places into which those impurities have been implanted. Additionally, the n$^-$ type drain region 26 that maintains the state of the n$^-$ type active layer 15 that has already made epitaxial growth is formed at a lower part of the p type channel region 12.

Next, the gate trench 9 and the source trench 13 are formed (step S3). The SiC substrate 2 is etched by use of a mask that has an opening in a region in which the gate trench 9 and the source trench 13 are to be formed. As a result, the SiC substrate 2 undergoes dry etching from its front surface, and the gate trench 9 and the source trench 13 are simultaneously formed. Simultaneously, many unit cells 10 are formed in the SiC substrate 2. It is possible to use, for example, a mixed gas ($SF_6/O_2$ gas) including sulfur hexafluoride ($SF_6$) and oxygen ($O_2$) or a mixed gas ($SF_6/O_2$/HBr gas) including $SF_6$, $O_2$, and hydrogen bromide (HBr) as an etching gas.

Figure 4:
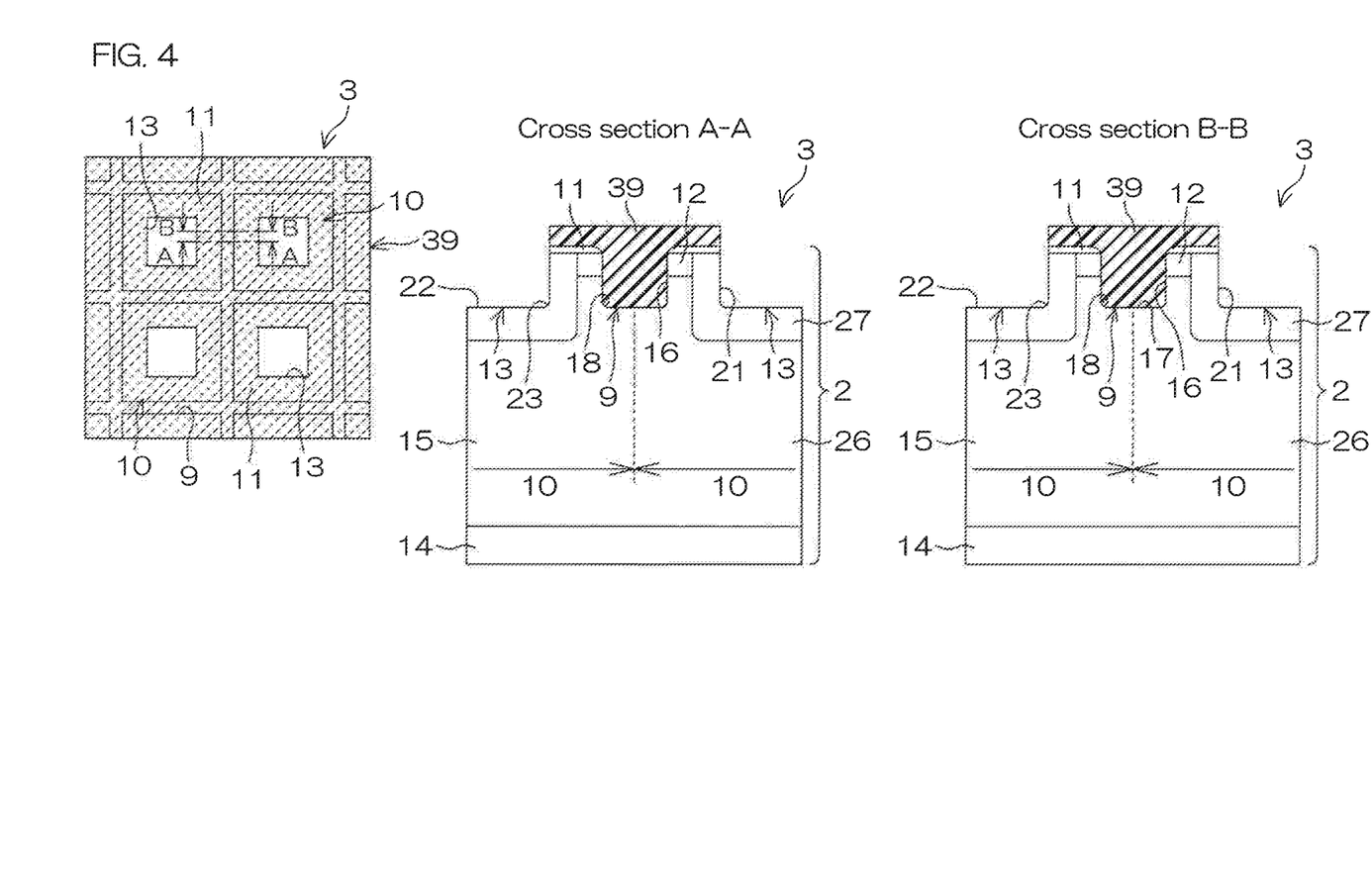
FIG. 4 is a view to describe the step that forms the p type region.

Thereafter, with reference to FIG. 4 in addition to FIG. 3, a mask 39 with which the whole area of the SiC substrate 2 excluding the source trench 13 is covered is formed on the SiC substrate 2. In the plan view of FIG. 4, an outlined part is the opening portion of the mask 39. Thereafter, the p type impurity is implanted toward the source trench 13 exposed from the opening portion of the mask 39. The implantation of this impurity is performed by diagonal implantation in which the impurity is allowed to strike in an inclined direction with respect to a normal direction of the front surface of the SiC substrate 2. The incident angle of the impurity is controlled by, for example, a magnetic field. As a result, the p type impurity is implanted into the entire inner surface of the source trench 13. Thereafter, the SiC substrate 2 is annealed at, for example, 1400° C. to 2000° C. (step S4). As a result, the p type impurity implanted thereinto is activated, and the p type region 27 is formed.

Figure 5:
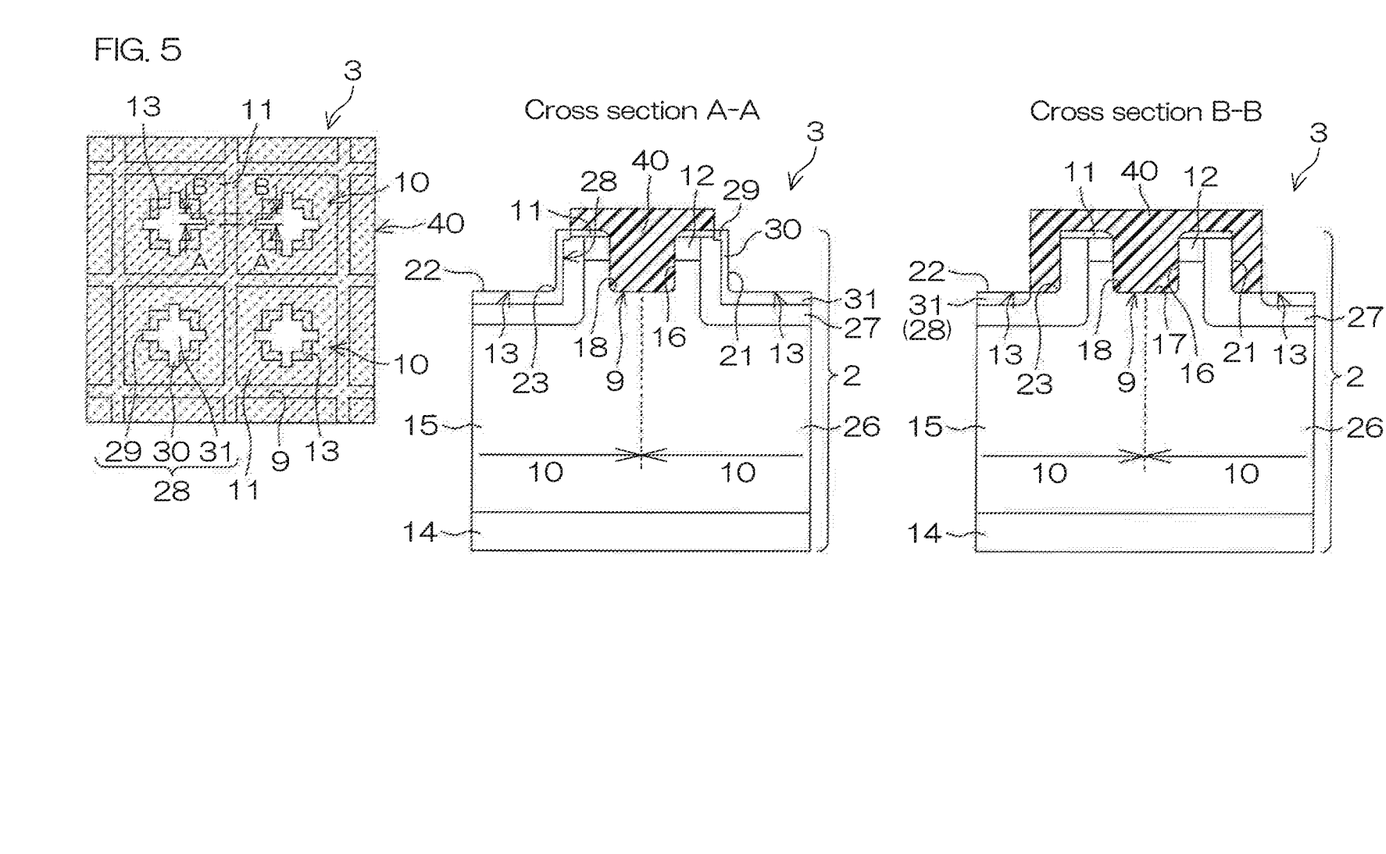
FIG. 5 is a view to describe a step of forming a $p^+$ type channel contact region.

Thereafter, with reference to FIG. 5 in addition to FIG. 3, a mask 40 that selectively exposes the source trench 13 and a part of the $n^+$ type source region 11 is formed on the SiC substrate 2. In the plan view of FIG. 5, an outlined part is the opening portion of the mask 40. Thereafter, the p type impurity is implanted toward the source trench 13 and the $n^+$ type source region 11 exposed from the opening portion of the mask 40. At this time, the p type impurity is implanted under the condition that it is higher in dose amount and is lower in energy than when the p type region 27 is formed. Additionally, the implantation of this impurity is performed by diagonal implantation in which the impurity is allowed to strike in an inclined direction with respect to the normal direction of the front surface of the SiC substrate 2. Thereafter, the SiC substrate 2 is annealed at, for example, 1400° C. to 2000° C. (step S5). As a result, the p type impurity implanted thereinto is activated, and the $p^+$ type channel contact region 28 that integrally includes the first contact portion 29, the longitudinal extension portion 30, and the second contact portion 31 is formed.

Next, the gate insulating film 19 and the gate electrode 20 are formed (step S6). A $SiO_2$ material is deposited on the SiC substrate 2 according to, for example, the CVD method. As a result, the gate insulating film 19 is formed. Subsequently, a polysilicon material is deposited on the SiC substrate 2 according to, for example, the CVD method. The polysilicon material continues to be deposited at least until the gate trench 9 and the source trench 13 are completely filled therewith. Thereafter, the polysilicon material is etchbacked until an etchback surface becomes flush with the front surface of the SiC substrate 2. As a result, the gate electrode 20 is formed. At this time, an electrode-film residue 25 made of a remaining polysilicon material is formed at the source trench 13.

Next, the interlayer film 32 that has the contact hole 33 is formed (step S7). A $SiO_2$ material is deposited on the SiC substrate 2 according to, for example, the CVD method. As a result, the interlayer film 32 is formed. Subsequently, the interlayer film 32 and the gate insulating film 19 continuously undergo patterning. As a result, the contact hole 33 that passes through the interlayer film 32 and through the gate insulating film 19 is formed. At this time, in the source trench 13, a part of the gate insulating film 19 remains as the insulating-film residue 24 at a part sandwiched between the electrode-film residue 25 and the inner surface of the source trench 13.

Thereafter, the source electrode 5, the drain electrode 36, etc. are formed (step S8), and, as a result, the semiconductor device 1 shown in FIG. 2 is obtained.

According to the semiconductor device 1, it is possible to use the first contact portion 29 and the longitudinal extension portion 30 as an electric-charge path to the p type channel region 12. Additionally, the $p^+$ type channel contact region 28 is formed according to diagonal implantation under the condition that it is higher in dose amount and is lower in energy than when the p type region 27 is formed. This makes it possible to also efficiently implant the impurity into the side surface 21 of the source trench 13 in which an impurity-implantation amount is liable to become smaller than in the front surface of the SiC substrate 2 or in the bottom surface 22 of the source trench 13, and makes it possible to form the longitudinal extension portion 30 along the side surface 21 of the source trench 13 without disconnection. On the other hand, although the p type region 27 is formed according to diagonal implantation, there is a case in which disconnection occurs particularly in the side surface 21 of the source trench 13 because it has a wider range and a smaller dose amount than the $p^+$ type channel contact region 28. However, in the semiconductor device 1, it is possible to reliably make contact with the p type channel region 12 by means of the $p^+$ type channel contact region 28 even if disconnection occurs in the p type region 27. Additionally, it is possible to restrain variation in gate threshold voltage by using the $p^+$ type channel contact region 28 that is lower in resistance than the p type region 27 as an electric-charge path. As a result, it is possible to restrain variation in ΔVth between chips in a semiconductor wafer plane, and therefore, if a module is formed by use of a plurality of chips that are individual pieces created from a semiconductor wafer in which the structure of the semiconductor device 1 has been employed, it is possible to reduce a switching time lag in the module.

Additionally, the first contact portion 29 is formed so as to extend from the four sides of the source trench 13 in different four directions. Therefore, for example, even if the mask 40 positionally deviates downwardly in the sheet of the drawing so that the formation region of one first contact portion 29 is covered with the mask 40 when the mask 40 of FIG. 5 is formed, it is possible to reliably expose the formation regions of the remaining three first contact portions 29. Therefore, it is possible to reliably format least three first contact portions 29. It is possible to achieve this effect, for example, even when the first contact portion 29 extends only in different two directions along the left-right direction of the drawing sheet. In other words, it is possible to reliably form at least right-hand first contact portions 29 placed on the right side of the drawing sheet even if the mask 40 positionally deviates in the left-right direction of the drawing sheet.

Figure 6:
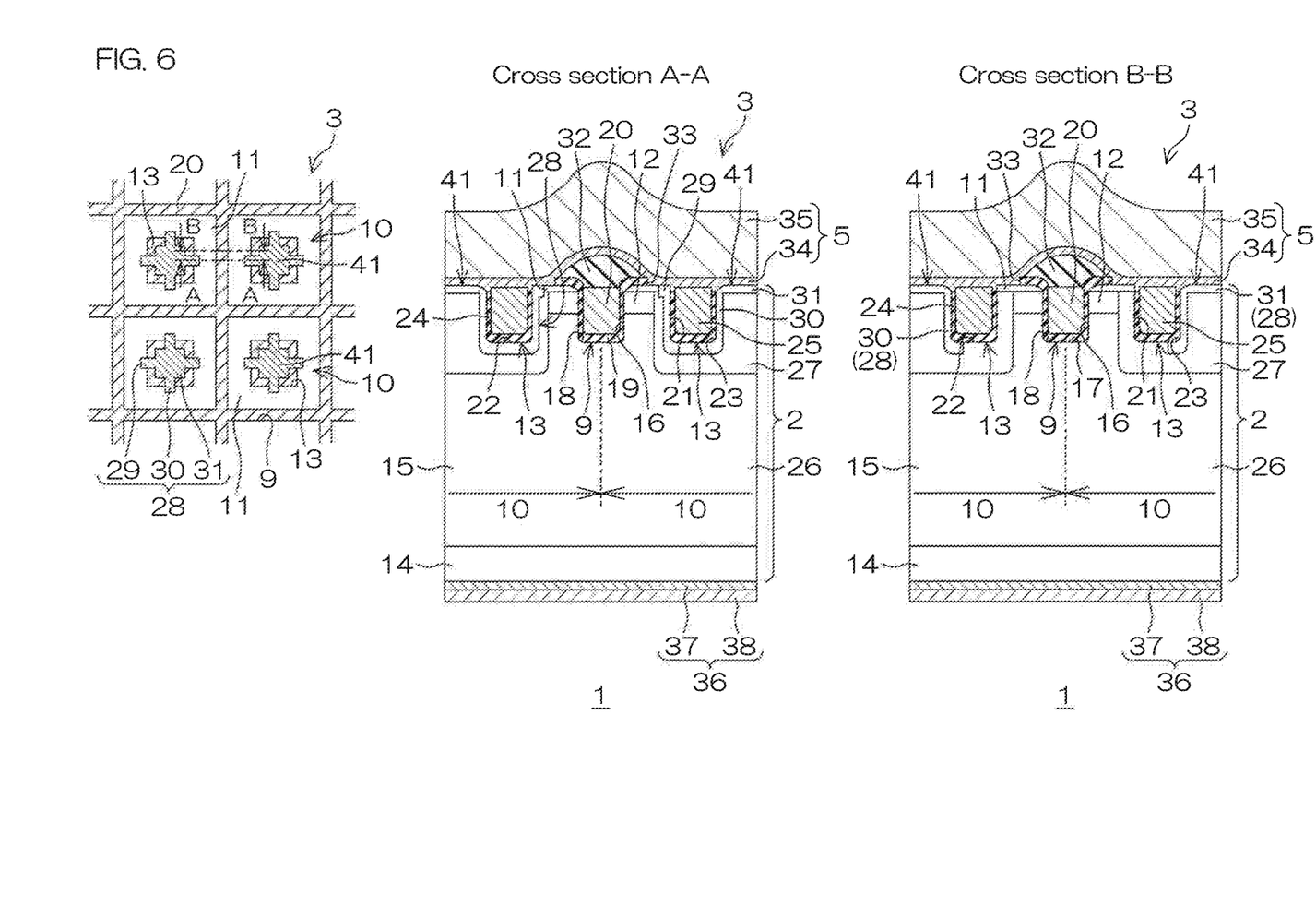
FIG. 6 is a view to describe one preferred embodiment of the semiconductor device.

FIG. 6 is a view showing one preferred embodiment of the semiconductor device 1 in detail, in which the source trench 13 has the second pattern. In FIG. 6, the same reference sign is given to a component corresponding to each component shown in FIGS. 1 to 5 mentioned above, and a description of this component is omitted.

In FIG. 6, the source trench 13 is formed in a quadrangular ring shape in a plan view. As a result, a convex portion 41 (mesa portion) defined by inner peripheral sides of the source trench 13 is formed in an inner region of the source trench 13. Additionally, the source trench 13 has the same depth and width as the gate trench 9.

The p type region 27 is formed at an outer edge part of the source trench 13 and in the whole of its inner region in the same way as the arrangement of FIG. 2. Therefore, the p type region 27 has an outer surface that extends from the p type channel region 12 in the longitudinal direction along the side surface 21 and that extends in the lateral direction along the bottom surface 22, and, in addition, has an outer surface that extends in the lateral direction along the front surface of the SiC substrate 2 below the convex portion 41. As a result, the semiconductor device 1 of FIG. 6 has the p type region 27 formed deeper than the source trench 13 below the convex portion 41. In the present preferred embodiment, the convex portion 41 has its most parts consisting of the p type region 27, which exclude its surface part.

With respect to the p$^+$ type channel contact region 28, the second contact portion 31 is formed at the whole of the surface part of the convex portion 41. The longitudinal extension portion 30 is formed so as to come around through the bottom part of the source trench 13 from the outer edge part to the inner edge part of the source trench 13. It is connected to the first contact portion 29 at the outer edge part thereof, and is connected to the second contact portion 31 at the inner edge part thereof. In other words, the longitudinal extension portion 30 includes parts that are formed at the side part and the bottom part on the outer side of the source trench 13 and that are formed at the side part on the inner side of the source trench 13 in a side portion (cross section A-A) of the source trench 13. Additionally, the longitudinal extension portion 30 includes parts that are not formed at the side part and the bottom part on the outer side of the source trench 13 and that are selectively formed at the side part on the inner side of the source trench 13 in a corner portion (cross section B-B) of the source trench 13.

The insulating-film residue 24 is formed at the entire inner surface of the source trench 13, and the electrode-film residue 25 is embedded in the inside thereof. In other words, in a cross-sectional view, the insulating-film residue 24 and the electrode-film residue 25 have the same arrangement as the gate insulating film 19 and the gate electrode 20, except that those residues are not covered with the interlayer film 32.

Each of the other arrangements is the same as that of FIG. 2. It is possible to fulfill the same operation and effect by the arrangement of FIG. 6 as by the arrangement of FIG. 2.

Figure 7:
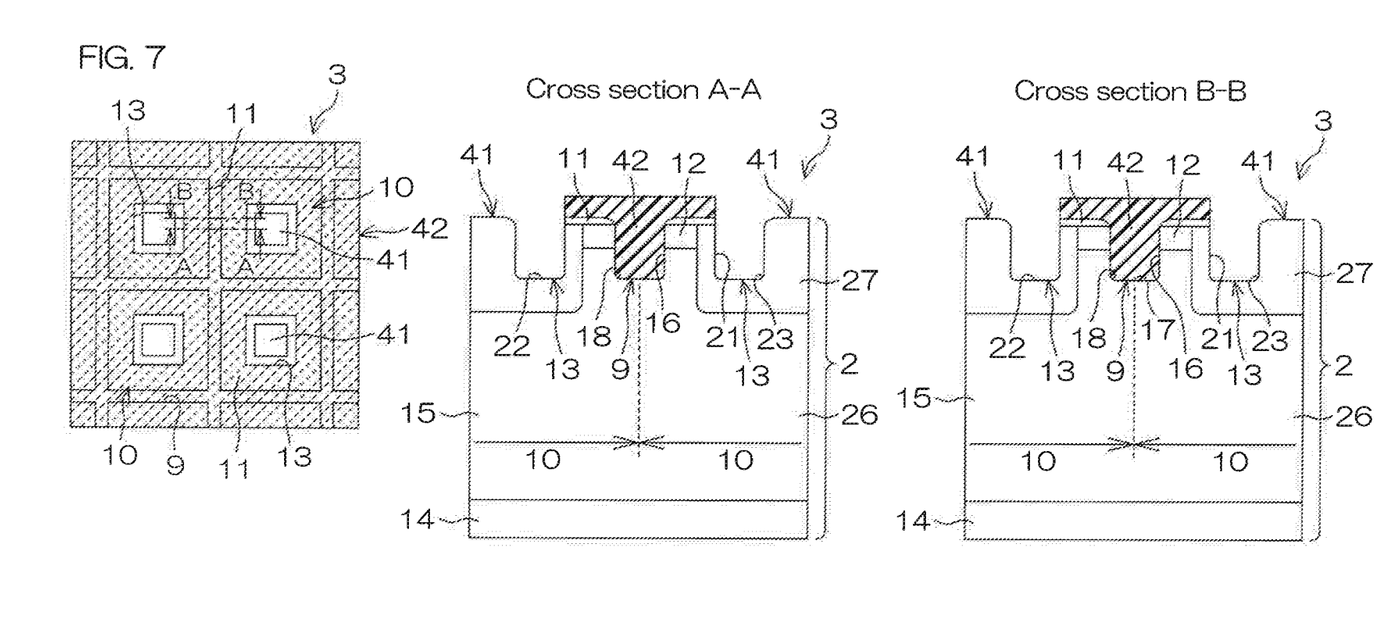
FIG. 7 is a view to describe a step of forming a p type region.
Figure 8:
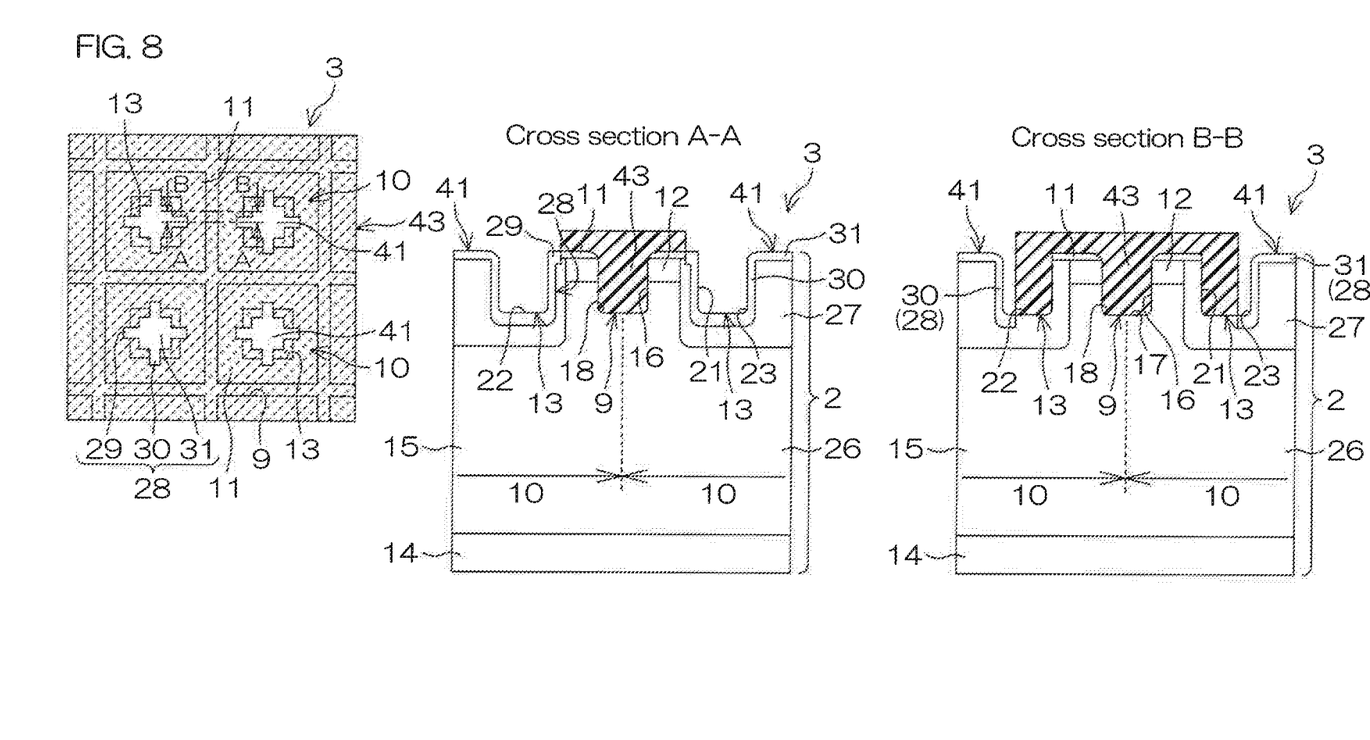
FIG. 8 is a view to describe a step of forming a $p^+$ type channel contact region.

In order to form the p type region 27 of FIG. 6, it is recommend to use a mask 42 with which the whole area of the n$^+$ type source region 11 excluding both the source trench 13 and the convex portion 41 is covered as shown in FIG. 7 when a p type impurity is implanted. Additionally, in order to form the p$^+$ type channel contact region 28 of FIG. 6, it is recommended to use a mask 43 by which the whole of the convex portion 41 is exposed and by which the source trench 13 and a part of the n+ type source region 11 are selectively exposed as shown in FIG. 8 when a p type impurity is implanted.

Although the preferred embodiment of the present invention has been described as above, the present invention can be embodied in other modes.

Figure 9:
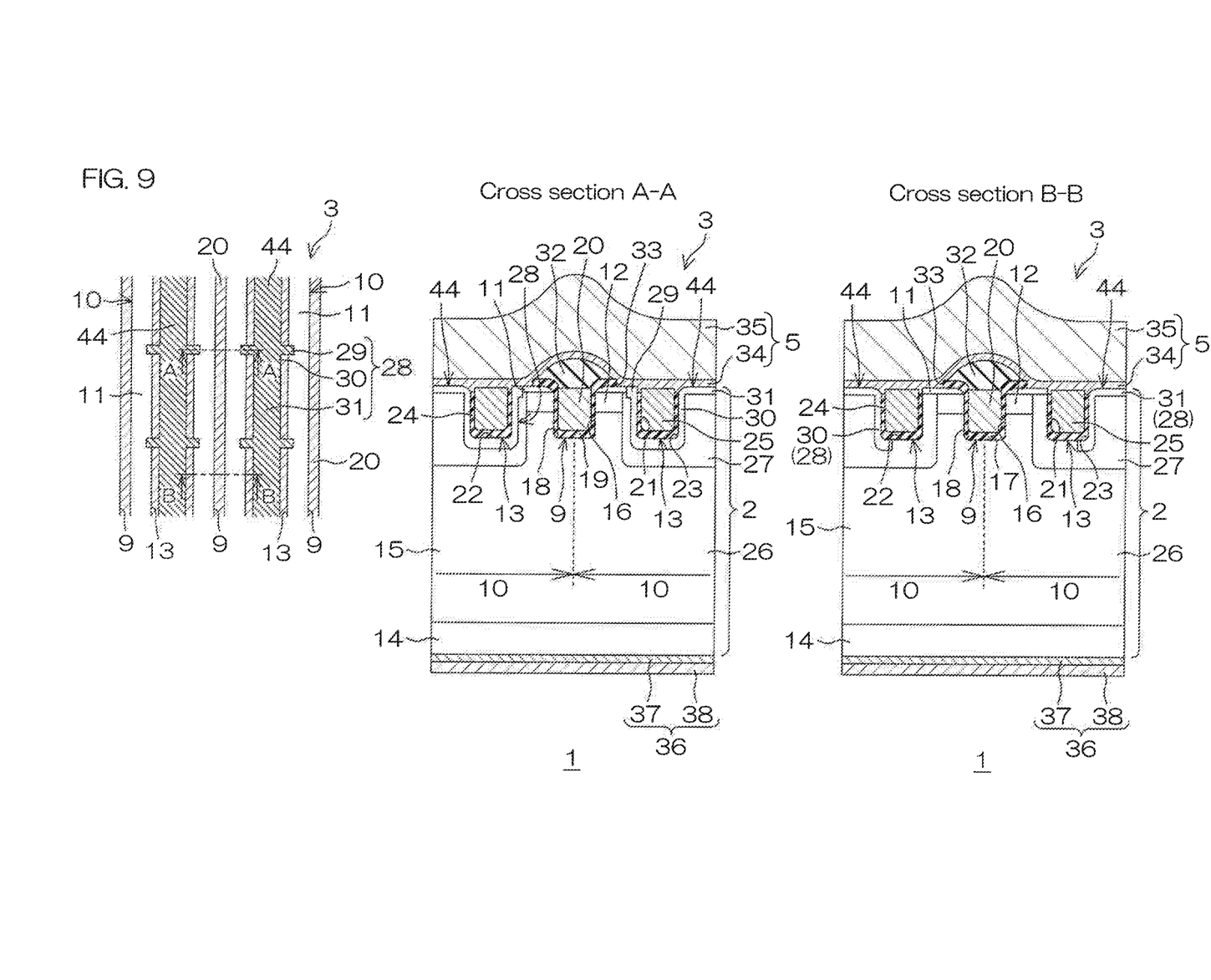
FIG. 9 is a view to describe one preferred embodiment of the semiconductor device.

For example, as shown in FIG. 9, the gate trench 9 may be formed in a stripe manner, and two stripe-shaped source trenches 13 may be formed between the gate trenches 9. As a result, a repeated pattern of a line-and-space shape may be formed by the gate trench 9 and the source trench 13. A convex portion 44 (stripe mesa portion) defined by the inner peripheral sides of the source trench 13 is formed between the two source trenches 13. The second contact portion 31 may be formed at the surface part of the convex portion 44, of course, in the same way as in FIG. 6.

Figure 10:
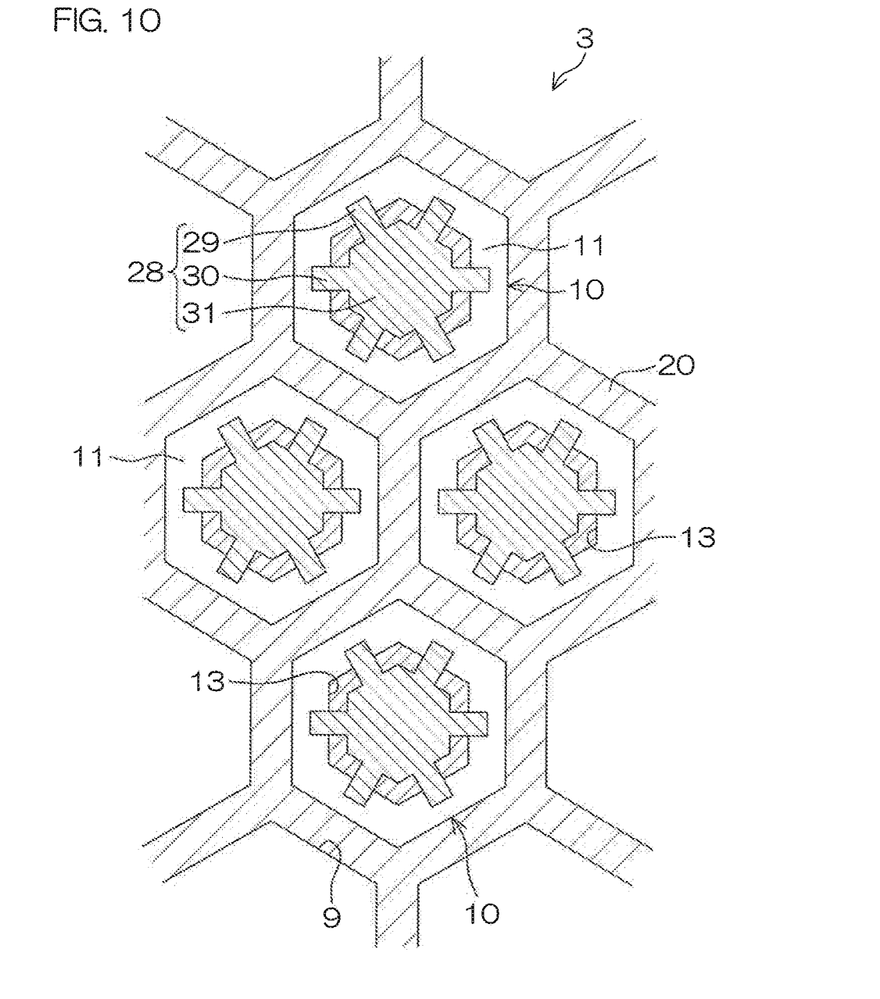
FIG. 10 is a view to describe one preferred embodiment of the semiconductor device.

Additionally, as shown in FIG. 10, the gate trench 9 may be formed in a honeycomb manner, and, as a result, a repeated pattern of a regular hexagonal unit cell 10 may be formed. In this case, the source trench 13 may have a regular hexagonal shape or a regular hexagonal ring shape in a plan view.

Additionally, for example, the longitudinal extension portion 30 is not required to be exposed to the inner surface of the source trench 13 if the p$^+$ type channel contact region 28 is formed such that the first contact portion 29 is able to make contact with the front surface of the SiC substrate 2. In other words, the first contact portion 29 is not necessarily required to be formed at the peripheral edge part of the source trench 13, and can be formed at an arbitrary position of the n$^+$ type source region 11.

Additionally, the second contact portion 31 that has a longer distance from the p type channel region 12 than the first contact portion 29 can also be excluded if necessary.

Additionally, an arrangement in which the conductivity type of each semiconductor part of the aforementioned semiconductor device 1 has been reversed may be employed. For example, in the semiconductor device 1, the p type part may be an n type part, and the n type part may be a p type part.

Additionally, a semiconductor employed in the semiconductor device 1 is not limited to SiC, and may be, for example, Si, GaN, diamond, or the like.

Besides, various design changes can be made within the scope of the subject matter recited in the claims.

The present application corresponds to Japanese Patent Application No. 2014-233653 filed in the Japan Patent Office on Nov. 18, 2014, and the entire disclosure of the application is incorporated herein by reference.

PREFERRED EMBODIMENT

Figure 11:
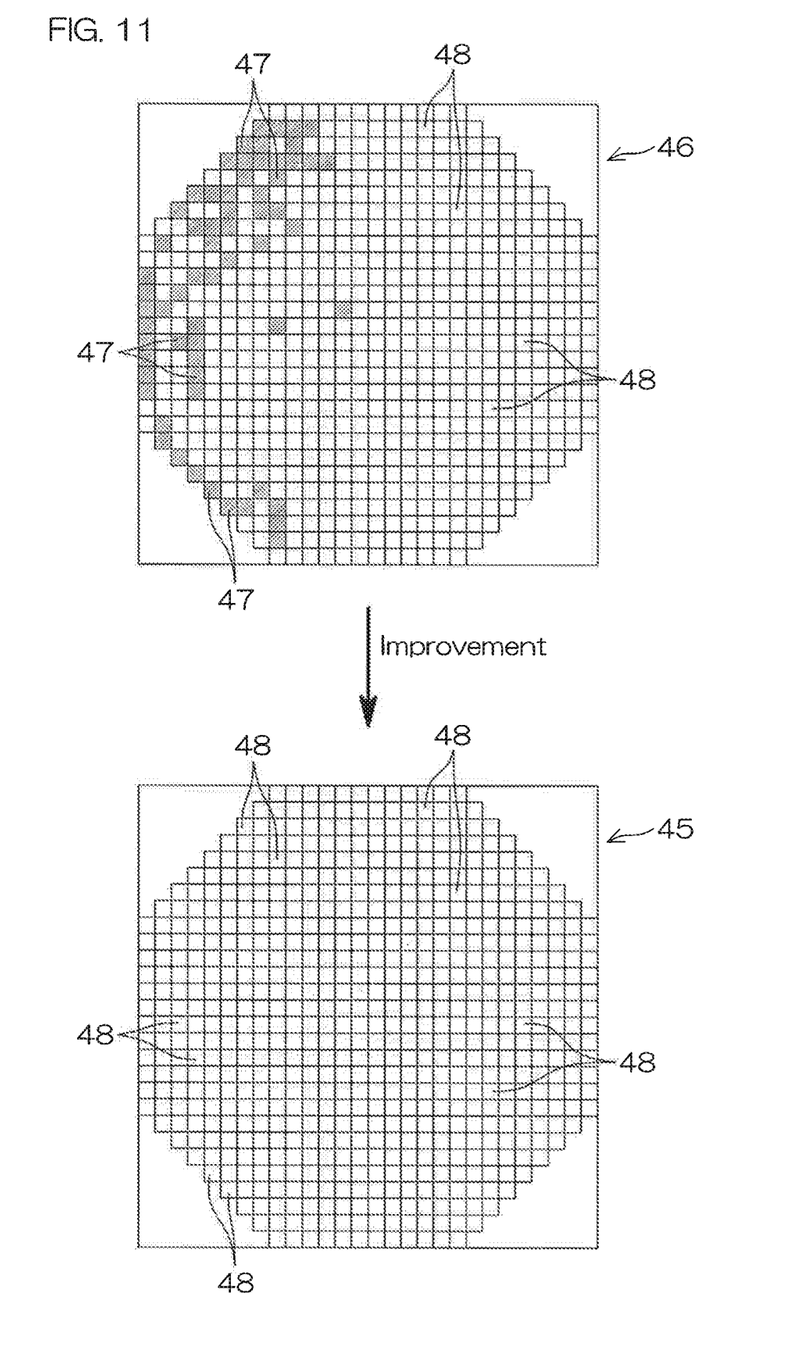
FIG. 11 is a view to describe a variation improvement effect of ΔVth.

In order to prove the effect of the aforementioned preferred embodiment, variation in ΔVth was verified with respect to a semiconductor wafer 45 that employs an improved structure of the semiconductor device 1 and a semiconductor wafer 46 that does not employ an improved structure of the semiconductor device 1 as shown in FIG. 11. In the latter structure, the p$^+$ type channel contact region 28 consisting of only the second contact portion 31 was formed without forming the first contact portion 29 and the longitudinal extension portion 30.

As shown in FIG. 11, in the semiconductor wafer 46 that does not employ the improved structure, chips 47 (hatched chips) of ΔVth=0.9 V were distributed chiefly at a wafer peripheral edge part, whereas chips 48 (outlined chips) of ΔVth=0.5 V to 0.6 V were roughly distributed in the other regions. In other words, in the semiconductor wafer 46, variation in ΔVth between chips in a wafer plane was remarkable. On the other hand, in the semiconductor wafer 45 that employs the improved structure, chips 48 of ΔVth=0.5 V to 0.6 V were distributed in most regions, and variation in ΔVth was small.

REFERENCE SIGNS LIST

1 Semiconductor device
2 SiC substrate
5 Source electrode
9 Gate trench
11 n$^+$ type source region
12 p type channel region
13 Source trench 16 (Gate trench) Side surface
17 (Gate trench) Bottom surface
18 (Gate trench) Corner portion
21 (Source trench) Side surface
22 (Source trench) Bottom surface
23 (Source trench) Corner portion
25 Electrode-film residue
27 p type region
28 $p^+$ type channel contact region
29 First contact portion
30 Longitudinal extension portion
31 Second contact portion
39 Mask
40 Mask
41 Convex portion
42 Mask
43 Mask
44 Convex portion

The invention claimed is:

1. A semiconductor device comprising:
   a semiconductor layer;
   a first trench formed between source regions of a first conductivity type in the semiconductor layer;
   an electrode member formed in the first trench;
   a channel region of a second conductivity type formed under a source region of the source regions;
   a second trench penetrating the source region and the channel region such that the second trench is formed deeper than the source region and the channel region in the semiconductor layer;
   a residue portion made of the same material as the electrode member, wherein the residue portion is formed above a bottom surface of the second trench in a sectional view, with a part of the bottom surface of the second trench exposed from the residue portion;
   a first impurity region of the second conductivity type formed below the second trench;
   a source electrode formed on the semiconductor layer; and
   a second impurity region of the second conductivity type, the second impurity region having a contact portion connected to the source electrode at a surface of the semiconductor layer, the second impurity region passing through the source region and extending to a position deeper than the source region.

2. The semiconductor device according to claim 1, wherein the second trench has a width larger than a width of the first trench.

3. The semiconductor device according to claim 2, wherein the second trench has the same depth as the first trench.

4. The semiconductor device according to claim 3, wherein the source electrode has a portion formed on the bottom surface of the second trench.

5. The semiconductor device according to claim 4, wherein the contact portion has a boundary portion with a part of the source region.

6. The semiconductor device according to claim 5, further comprising a first film formed on an inner surface of the first trench.

7. The semiconductor device according to claim 6, further comprising a second film formed in part on an inner surface of the second trench.

8. The semiconductor device according to claim 7, further comprising a third film formed on the electrode member.

9. The semiconductor device according to claim 8, wherein the residue portion selectively covers an interior portion of the second trench.

10. The semiconductor device according to claim 9, wherein the first trench is formed in a grid-shaped manner.

11. The semiconductor device according to claim 10, wherein the third film has a thickness larger than a thickness of the first film and a thickness of the second film.

12. The semiconductor device according to claim 11, wherein the electrode member is made of polysilicon.

13. The semiconductor device according to claim 12, wherein the source electrode is made of aluminum.

14. The semiconductor device according to claim 13, wherein the source electrode has a concave portion on a surface thereof such that the concave portion is formed over the second trench.

15. The semiconductor device according to claim 6, wherein the first film is made of silicon oxide.

16. The semiconductor device according to claim 7, wherein the second film is made of silicon oxide.

17. The semiconductor device according to claim 8, wherein the third film is made of silicon oxide.

18. The semiconductor device according to claim 1, further comprising:
    plural channel regions of the second conductivity type; and
    plural second trenches,
    wherein each of the channel regions is formed under a respective one of the source regions, and
    each of the second trenches penetrates a respective one of the source regions and a respective one of the channel regions.

* * * * *